(12) United States Patent
Kim (10) Patent No.: US 8,143,127 B2
(45) Date of Patent: Mar. 27, 2012

(54) SEMICONDUCTOR DEVICE HAVING ASYMMETRIC BULB-TYPE RECESS GATE AND METHOD FOR MANUFACTURING THE SAME

(75) Inventor: Kyung Do Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/887,694

(22) Filed: Sep. 22, 2010

(65) Prior Publication Data

US 2011/0008942 A1    Jan. 13, 2011

Related U.S. Application Data

(62) Division of application No. 11/647,875, filed on Dec. 29, 2006, now Pat. No. 7,825,463.

(30) Foreign Application Priority Data

Sep. 30, 2006    (KR) .................. 10-2006-0096719

(51) Int. Cl.
*H01L 21/336* (2006.01)

(52) U.S. Cl. ........ 438/286; 438/270; 257/330; 257/332; 257/334; 257/E21.41; 257/E21.429

(58) Field of Classification Search .................. 438/270, 438/286; 257/330, 331, 332, 334, E21.233, 257/E21.335, E21.41, E21.429
See application file for complete search history.

(56) References Cited

U.S. PATENT DOCUMENTS

| 6,605,838 | B1 | 8/2003 | Mandelman et al. |
| 2006/0237817 | A1 | 10/2006 | Park |
| 2007/0026633 | A1* | 2/2007 | Lee ............................... 438/424 |
| 2007/0155148 | A1* | 7/2007 | Kim .............................. 438/589 |
| 2007/0235778 | A1 | 10/2007 | Shim |
| 2009/0114999 | A1 | 5/2009 | Seo et al. |

OTHER PUBLICATIONS

USPTO OA mailed Jun. 9, 2009 for U.S. Appl. No. 11/647,875.
USPTO OA mailed Aug. 5, 2009 for U.S. Appl. No. 11/647,875.
USPTO OA mailed Jan. 20, 2010 for U.S. Appl. No. 11/647,875.
USPTO NOA mailed Jun. 25, 2010 for U.S. Appl. No. 11/647,875.

* cited by examiner

*Primary Examiner* — Matthew Landau
*Assistant Examiner* — Colleen E Snow
(74) *Attorney, Agent, or Firm* — Ladas & Parry LLP (57) ABSTRACT

A semiconductor device includes a silicon substrate; a device isolation structure formed in the silicon substrate to delimit an active region which has a pair of gate forming areas, a drain forming area between the gate forming areas, and source forming areas outside the gate forming areas; an asymmetric bulb-type recess gate formed in each gate forming area of the active region and having the shape of a bulb on the lower end portion of the sidewall thereof facing the source forming area; and source and drain areas respectively formed on the surface of the substrate on both sides of the asymmetric bulb-type recess gate.

11 Claims, 5 Drawing Sheets

SEMICONDUCTOR DEVICE HAVING ASYMMETRIC BULB-TYPE RECESS GATE AND METHOD FOR MANUFACTURING THE SAME

CROSS-REFERENCE TO RELATED APPLICATIONS

The present application claims priority to Korean patent application number 10-2006-0096719 filed on Sep. 30, 2006, which is incorporated by reference in its entirety.

BACKGROUND OF THE INVENTION

The present invention relates to a semiconductor device, and more particularly, to a semiconductor device having an asymmetric bulb-type recess gate which increases the effective channel length and prevents the threshold voltage from decreasing under the reciprocal influence between gates, and a method for manufacturing the same.

As the design rule for developing the semiconductor devices falls below a 100 nm level, a short channel effect, in which the threshold voltage quickly decreases due to the reduction of the channel length, becomes more critical. Therefore, limitations necessarily exist in the process and device configuration when attaining a target threshold voltage as required in a semiconductor device using the conventional plane transistor structure.

Consequently, in order to overcome the problems induced by the short channel effect, a semiconductor device having a recess gate is disclosed in the conventional art. In such a conventional semiconductor device, a groove is first defined on an area of the silicon substrate, and the gate is subsequently formed in the groove such that an effective channel length is increased.

Further, a technique for defining a bulb-type groove during the manufacture of semiconductor devices of sub 70 nm is disclosed in the conventional art. The recess gate (hereinafter referred to as "the bulb-type recess gate") formed in the bulb-type groove allows the effective channel length to be further increased when compared to a typical recess gate; and the doping concentration of a substrate to be further decreased; and a drain-induced barrier lowering ("DBIL") characteristics to be further improved.

Figure 1:
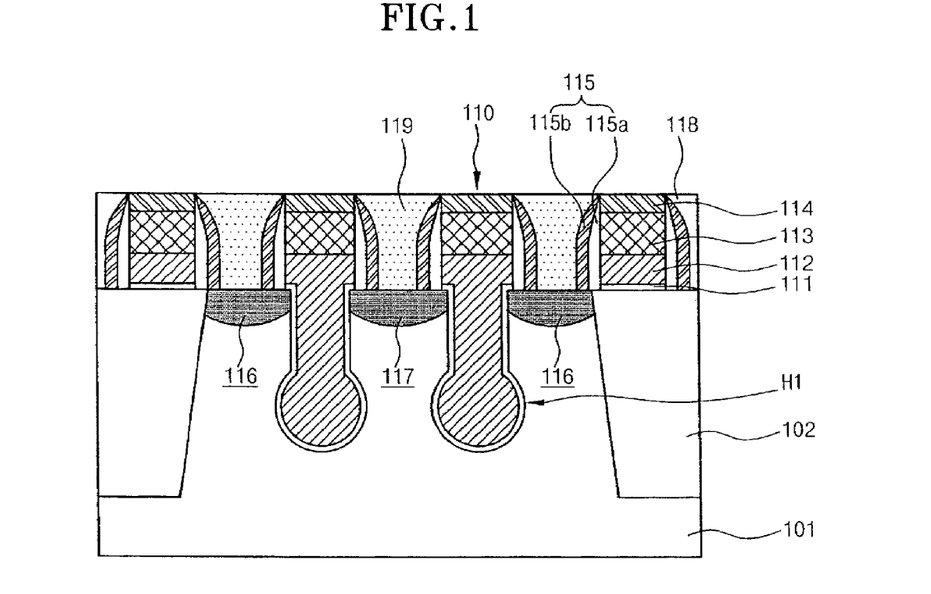
FIG. 1 is a cross-sectional view illustrating a conventional semiconductor device having a bulb-type recess gate.

FIG. 1 is a cross-sectional view illustrating a conventional semiconductor device having a bulb-type recess gate. A device isolation structure 102 is formed on a silicon substrate 101 to delimit (or define) an active region. The bulb-type groove H1 is defined in the gate forming area of the active region, and the bulb-type recess gate 110 is formed in the bulb-type groove H1.

Also, gate spacers 115, each comprising a double layer composed of an oxide layer 115a and a nitride layer 115b, are respectively formed on both sidewalls of the bulb-type recess gate 110. Source and drain areas 116 and 117 are respectively formed on the surface of the silicon substrate 101 on both sides of the bulb-type recess gate 110. Landing plugs 119 are formed on areas between bulb-type recess gates 110, including the gate spacers 115, on the source and drain areas 116 and 117.

In FIG. 1, the reference numerals 111 to 114 and 118 designate: a gate oxide layer 111, a gate polysilicon layer 112, a gate tungsten silicide layer 113, a gate hard mask layer 114, and an interlayer insulation layer 118.

Since the semiconductor device having a bulb-type recess gate possesses a recessed channel structure, the short-channel effect is improved when compared to a conventional semiconductor device with a basic planar channel structure. Also, because the lower end of the groove has a spherical profile, the effective channel length is further increased when compared to a semiconductor device containing a typical recess gate characterized by a vertical profile.

Although the conventional bulb-type recess gate as described above provides some advantages to a conventional semiconductor device having the bulb-type recess gate, numerous problems exist in that, since the lower end of the gate is shaped like a bulb, the interval between the lower ends of adjoining gates is decreased. Therefore, the operation of one gate in a certain cell decreases the threshold voltage of the other gate, thereby degrading the leakage current characteristics and causing a critical problem. As a result, difficulties exist in adopting the bulb-type recess gate in the conventional art.

SUMMARY OF THE INVENTION

Embodiments of the present invention are directed to a semiconductor device having an asymmetric bulb-type recess gate which can prevent a threshold voltage from decreasing under the reciprocal influence between adjoining gates, and a method for manufacturing the same.

Also, the present invention is directed to a semiconductor device having an asymmetric bulb-type recess gate, which can prevent a threshold voltage from decreasing under the reciprocal influence between adjoining gates, thereby ensuring the desired leakage current characteristic, and a method for manufacturing the same.

In one embodiment, a semiconductor device comprises a silicon substrate; a device isolation structure formed on the silicon substrate to delimit (or define) an active region containing a pair of gate forming areas, a drain forming area between the gate forming areas, and source forming areas outside the gate forming areas; an asymmetric bulb-type recess gate formed in each gate forming area of the active region and having the shape of a bulb on a lower end portion of a sidewall thereof facing the sourceforming area; and source and drain areas respectively formed on the surface of the substrate on both sides of the asymmetric bulb-type recess gate.

The semiconductor device further comprises gate spacers formed on both sidewalls of the asymmetric bulb-type recess gate.

The semiconductor device further comprises landing plugs formed on the source and drain areas between the asymmetric bulb-type recess gates including the gate spacers.

In another embodiment, a method for manufacturing a semiconductor device comprises the steps of forming a device isolation structure on a silicon substrate, which delimits an active region having a pair of gate forming areas, a drain forming area between the gate forming areas, and source forming areas outside the gate forming areas; forming a hard mask on the silicon substrate, including the device isolation structure, and ensuring said hard mask has openings for exposing the gate forming areas; defining first grooves by etching exposed gate forming areas; forming spacers on sidewalls of the first grooves including the openings of the hard maskfacing the source forming areas; defining second grooves under the first grooves by etching exposed bottom portions of the first grooves using the hard mask including the spacers as an etch mask; removing the spacers and the hard mask; forming an oxide layer on the surface of the substrate including the first and second grooves to expose lower end portions of sidewalls of the second groovesfacing the source-forming areas; defining asymmetric bulb-type grooves, including the first and second grooves, by isotropically etching exposed lower end portions of the sidewalls of the second grooves to thereby form bulb-type grooves; removing the oxide layer; forming asymmetric bulbtype recess gates in the asymmetric bulbtype grooves; and forming source and drain areas on the surface of the substrate on both sides of the asymmetric bulb-type recess gates.

The hard mask is formed as a stacked layer of an oxide layer and a polysilicon layer.

The step of forming spacers comprises the sub steps of forming a spacer layer on the hard mask including the first grooves; forming spacers on both sidewalls of the first grooves including the openings of the hard mask by anisotropically etching the spacer layer; forming a photoresist pattern on the resultant substrate having the spacers formed on both sidewalls of the first grooves including the openings of the hard mask, such that the spacers formed on the sidewalls of the first grooves facing the source forming areas are covered by the photoresistant pattern, and the spacers formed on sidewalls of the first grooves facing the drain forming area are exposed; removing the exposed spacers formed on the sidewalls of the first grooves facing the drain forming area; and removing the photoresist pattern.

The step of forming an oxide layer to expose lower end portions of sidewalls of the second grooves facing the source forming areas comprises the sub steps of inclinedly implanting oxygen ions into the resultant substrate with the spacers and the hard mask removed, such that the oxygen ions are implanted only into portions of the resultant substrate excluding the lower end portions of the sidewalls of the second grooves facing the source forming areas; forming an oxide layer on the surface of the substrate including the first and second grooves through an oxidation process for the resultant substrate, such that the thickness of the oxide layer on the portion of the resultant substrate containing the implanted oxygen ions is greater than the thickness of the oxide layer on the portion of the resultant substrate lacking implanted oxygen ions; and wet etching the oxide layer to a thickness whereby portions of the oxide layer formed on the lower end portions of the sidewalls of the second groovesfacing the source forming areas are removed.

The inclined ion implantation of the oxygen ions is conducted at an angle of 1~10° with an energy of 1~50 KeV and a concentration of 1E12~5E15 ions/cm².

The step of defining the asymmetric bulb-type grooves is implemented by conducting isotropic etching for 10~60 seconds using Cl2, HBr and CF4 gases.

The step of forming asymmetric bulb-type recess gates comprises the sub steps of forming a gate insulation layer on the surface of the substrate including the asymmetric bulb-type grooves; forming a first gate conductive layer on the gate insulation layer to fill the asymmetric bulb-type grooves; planarizing a surface of the first gate conductive layer; sequentially forming a second gate conductive layer and a hard mask layer on the planarized first gate conductive layer; and etching the hard mask layer, the second gate conductive layer, the first gate conductive layer and the gate insulation layer.

The method further comprises the step of forming gate spacers, each comprising a double layer which is composed of an oxide layer and a nitride layer, after the step of etching the hard mask layer, the second gate conductive layer, the first gate conductive layer and the gate insulation layer is implemented.

The method further comprises the step of forming landing plugs on the source and drain areas between the asymmetric bulb-type recess gates after the implementation of the step of forming gate spacers.

DESCRIPTION OF SPECIFIC EMBODIMENTS

In the present invention, a bulb-type groove is defined so as to increase the effective channel length. The bulb-type groove is partially defined only on the lower end portion of the sidewall of a groove facing the source area, thereby allowing the asymmetrical definition of the bulb-type groove. In particular, since the bulb-type groove is defined so as to not protrude toward the drain area, the interval between adjoining gates does not decrease, thereby allowing the effective channel length in the present invention to be increased. The present invention also prevents the threshold voltage from changing and the leakage current characteristic from degrading under the reciprocal influence between adjoining gates.

Figure 2:
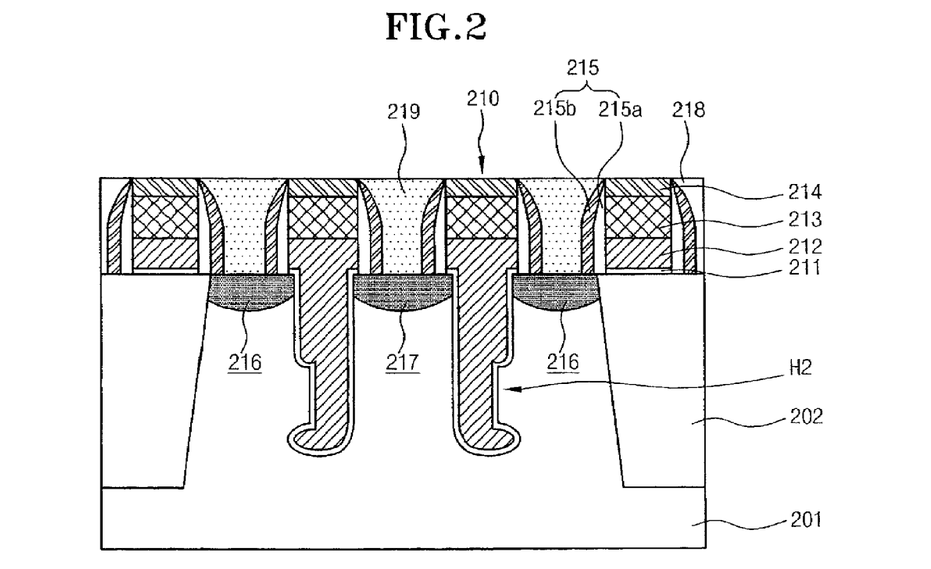
FIG. 2 is a cross-sectional view illustrating a semiconductor device having an asymmetric bulb-type recess gate in accordance with an embodiment of the present invention.

FIG. 2 is a cross-sectional view illustrating a semiconductor device having an asymmetric bulb-type recess gate in accordance with an embodiment of the present invention.

A device isolation structure 202 is formed in the silicon substrate 201. The device isolation structure 202 delimits (or defines) an active region which has a pair of gate forming areas, a drain forming area between the gate forming areas, and source forming areas outside the gate forming areas. Asymmetric bulb-type grooves H2 are defined in the gate forming areas of the active region, and asymmetric bulb-type recess gates 210 are formed in the asymmetric bulb-type grooves H2.

Unlike the conventional bulb-type groove in which the lower end has a left and right symmetrical shape, the lower end of each asymmetric bulb-type groove H2 according to the present invention has an asymmetric shape since the bulb-type groove is defined only on the sidewall facing the source forming area. Accordingly, the recess gate 210 formed in the asymmetric bulb-type groove H2 also has an asymmetrical configuration.

The asymmetric bulb-type recess gate 210 has a stacked construction which includes a gate insulation layer 211 formed on the surface of the asymmetric bulb-type groove H2, a polysilicon layer 212 filling the asymmetric bulb-type groove H2 including the gate insulation layer 211, a tungsten silicide layer 213 formed on the polysilicon layer 212, and a hard mask layer 214 formed on the tungsten silicide layer 213.

Source and drain areas 216 and 217 are formed on the surface of the substrate 201 on both sides of the asymmetric bulb-type recess gates 210. Gate spacers 215, each of which comprises a double layer composed of an oxide layer 215a and a nitride layer 215b, are formed on both sidewalls of each asymmetric bulb-type recess gate 210. Landing plugs 219 are formed on the source and drain areas 216 and 217 between the asymmetric bulb-type recess gates 210 including the gate spacers 215. In FIG. 2, the unexplained reference numeral 218 designates an interlayer insulation layer.

Since the semiconductor device having the asymmetric bulb-type recess gates in accordance with the present invention possesses a recessed channel structure, the effective channel length is increased allowing for an improved short channel effect. Also, since the bulb-type groove is defined on the lower end portion of the sidewall of each recess gate facing the source forming area, the interval between the lower ends of the gates is prevented from decreasing, thereby preventing the threshold voltage from changing and the leakage current characteristic from degrading under the reciprocal influence between the adjoining gates.

Hereafter, a method for manufacturing a semiconductor device having an asymmetric bulb-type recess gate in accordance with another embodiment of the present invention will be described with references to FIGS. 3A through 3H.

Figure 3A:
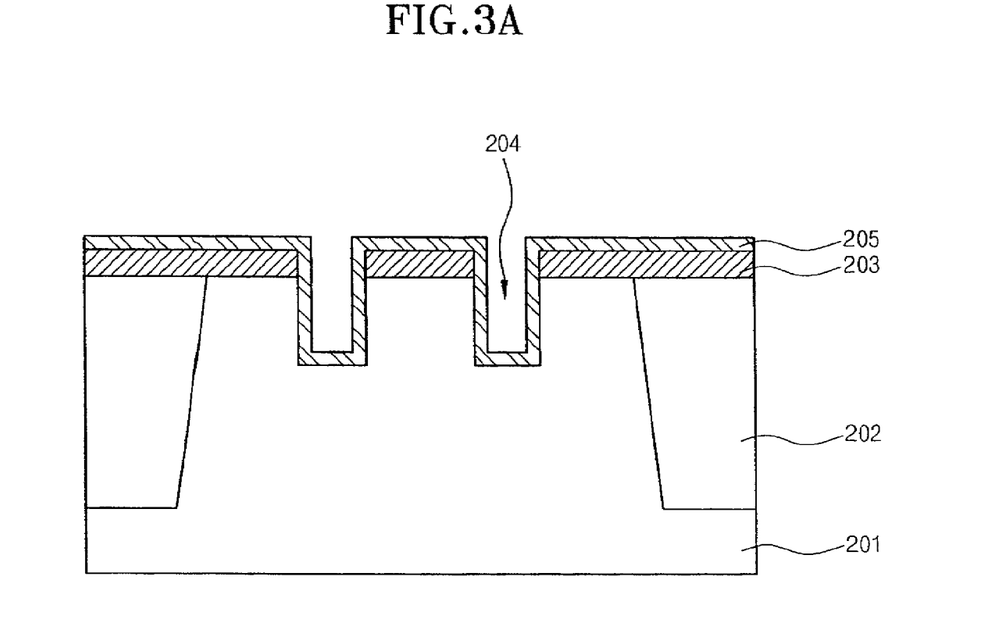
FIGS. 3A through 3H are cross-sectional views illustrating a method for manufacturing a semiconductor device having an asymmetric bulb-type recess gate in accordance with another embodiment of the present invention.

Referring to FIG. 3A, a device isolation structure 202 is formed on the silicon substrate 201 by conducting a shallow trench isolation ("STI") process in order to define the active region having a pair of gate forming areas, a drain forming area between the gate forming areas, and source forming areas outside the gate forming areas. A hard mask 203 is formed on the silicon substrate 201 including the device isolation structure 202 such that the hard mask 203 has openings for exposing the gate forming areas of the active region. For example, the hard mask 203 is formed as a stacked layer of an oxide layer and a polysilicon layer.

First grooves 204 are defined by etching the exposed gate forming areas of the active region using the hard mask 203 as an etch mask. A spacer nitride layer 205 is deposited on the hard mask 203 including the first grooves 204.

Figure 3B:
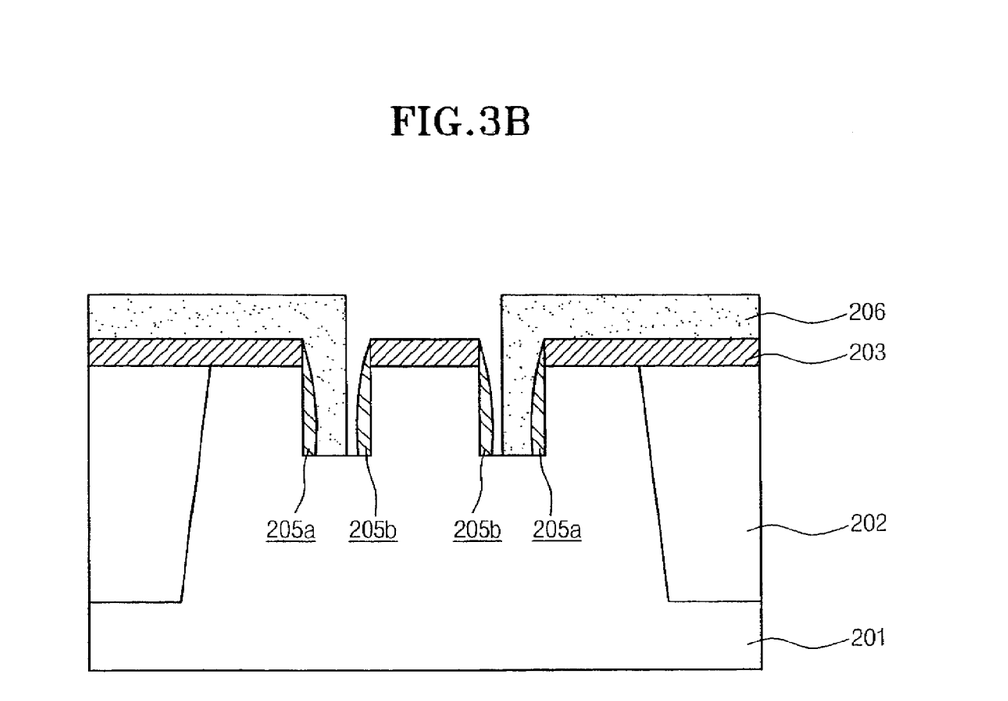

Referring to FIG. 3B, the spacer nitride layer 205 is anisotropically etched, and the first and second spacers 205a and 205b are respectively formed on both sidewalls of the first grooves 204 including the hard mask 203. The first spacers 205a are formed on the sidewalls of the first grooves 204 facing the source forming areas, and the second spacers 205b are formed on the sidewalls of the first grooves 204 which facing the drain forming area.

After a layer of photoresist is deposited on the entire surface of the resultant substrate formed by the first and second spacers 205a and 205b, by exposing and developing the photoresist layer, a photoresist pattern 206 is formed such that the first spacers 205a, formed on the sidewalls of the first grooves 204 facing the source forming areas, are covered by the photoresist pattern 206, and the second spacers 205b, formed on the sidewalls of the first grooves 204 facing the drain forming area, are exposed.

Figure 3C:
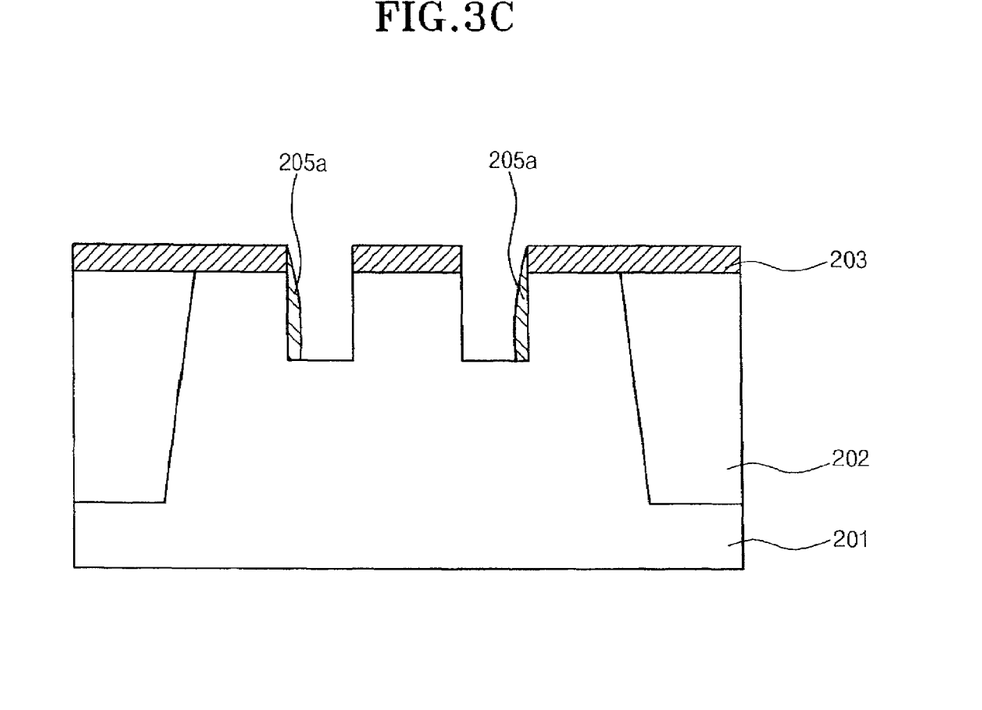

Referring to FIG. 3O, the second spacers 205b, which are not covered by the photoresist pattern 206, are removed by wet etching, and the photoresist pattern 206 used as an etch mask is removed by the well-known oxygen plasma process.

Figure 3D:
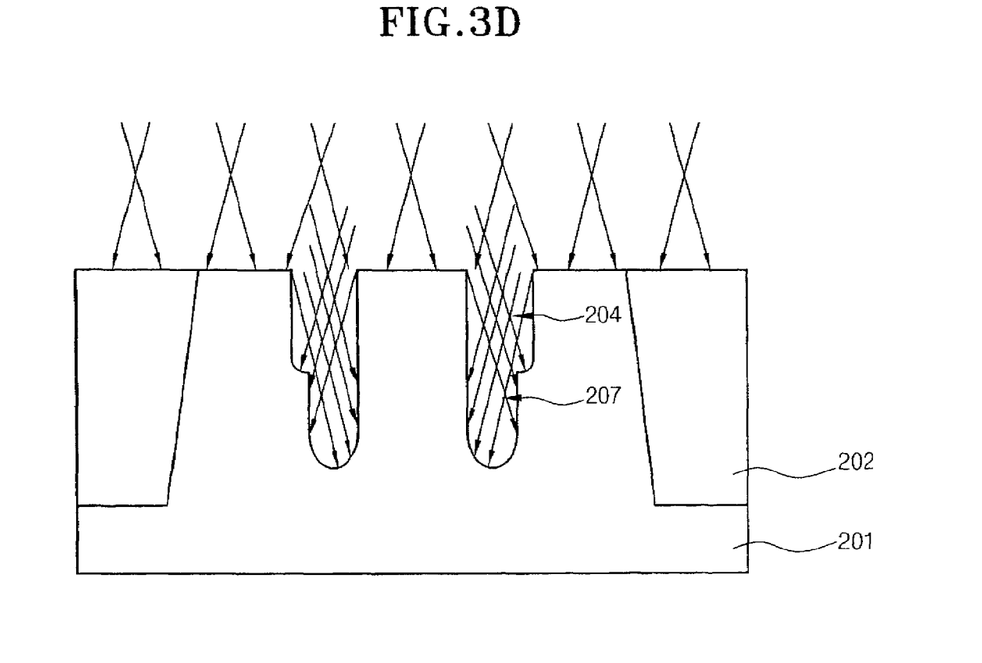

Referring to FIG. 3D, the exposed lower ends of the first grooves 204 are etched using the hard mask 203 including the remaining first spacers 205a as an etch mask, and the second grooves 207 are defined under the first grooves 204. Thereafter, the remaining first spacers 205a and hard mask 203 are removed.

Oxygen ions are inclinedly implanted into the surface of the resultant substrate including the first and second grooves 204 and 207, such that the oxygen ions are implanted only into particular portions of the resultant substrate, excluding the lower end portions of the sidewalls of the second grooves 207 facing the source forming areas. Preferably, the inclined ion implantation of the oxygen ions is conducted at an angle of 1~10° with an energy of 1~50 KeV and a concentration of 1E12~5E15 ions/cm$^2$.

Figure 3E:
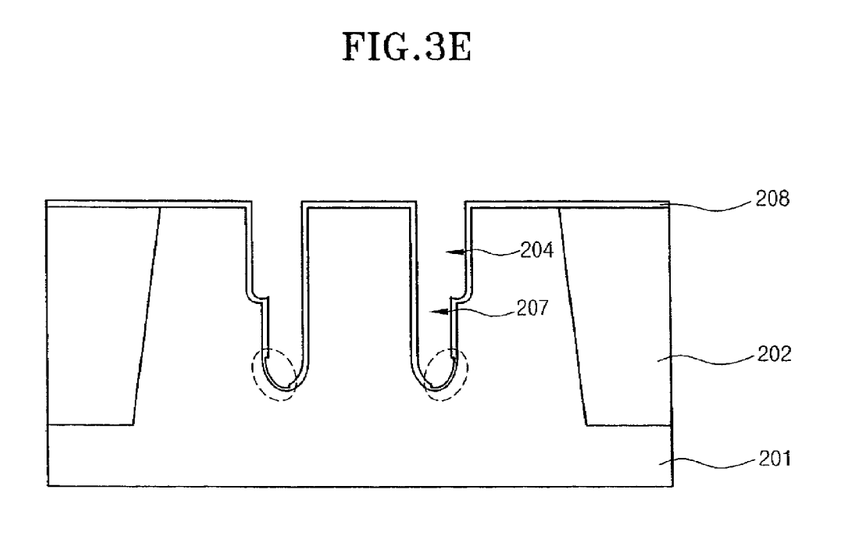

Referring to FIG. 3E, an oxidation process is conducted for the resultant substrate containing the oxygen ions, and an oxide layer 208 is formed on the surface of the substrate including the first and second grooves 204 and 207. At this time, the oxide layer 208 is formed such that the thickness of the oxide layer 208 on the portion of the resultant substrate containing the implanted oxygen ions is greater than the thickness of the oxide layer 208 on the portion of the resultant substrate into which oxygen ions were not implanted.

Figure 3F:
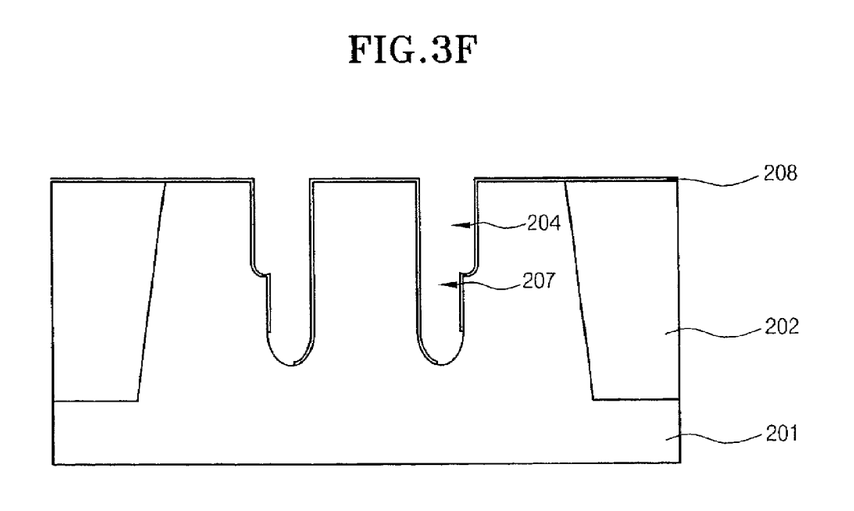

Referring to FIG. 3F, wet etching is conducted for the resultant substrate 201 having the oxide layer 208 formed on its surface including the first and second grooves 204 and 207. First, the relatively slimmer portions of the oxide layer 208 formed on the lower end portions of the sidewalls of the second grooves 207 facing the source forming areas and lacking the implanted oxygen ions are removed. As a result of the wet etching, the thicker portions of the oxide layer 208 implanted with the oxygen ions remain on the surface of the substrate 201 and have a reduced thickness.

Figure 3G:
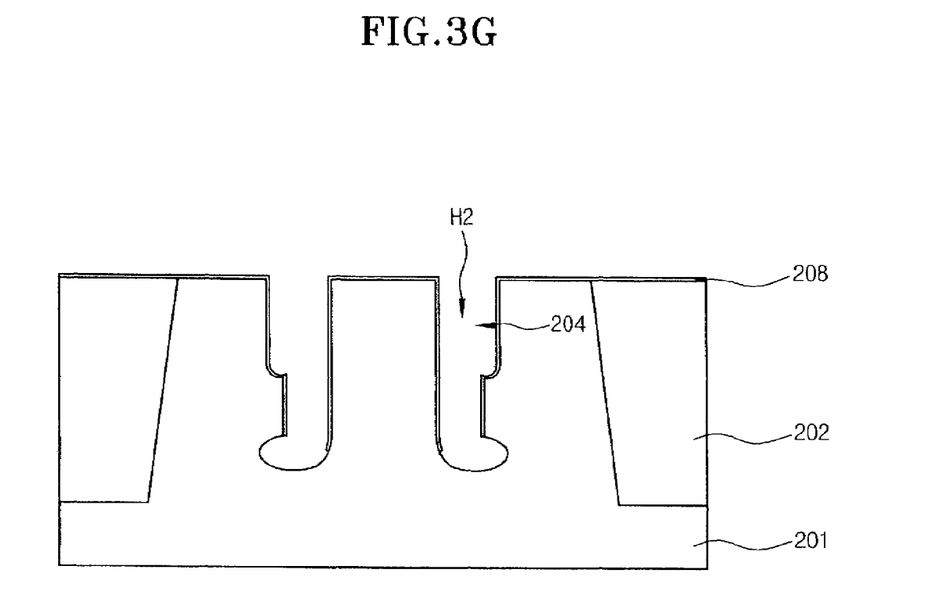

Referring to FIG. 3G, the lower end portions of the sidewalls of the now-exposed second grooves 207 facing the source forming areas are isotropically etched for 10~60 seconds using, for example, Cl2, HBr and CF4 gases. Thereby, asymmetric bulb-type grooves H2 are defined, which include the first and second grooves 204 and 207 and in which bulb-type grooves are defined on the lower end portions of the sidewalls of the second grooves 207 facing the source forming areas.

Figure 3H:
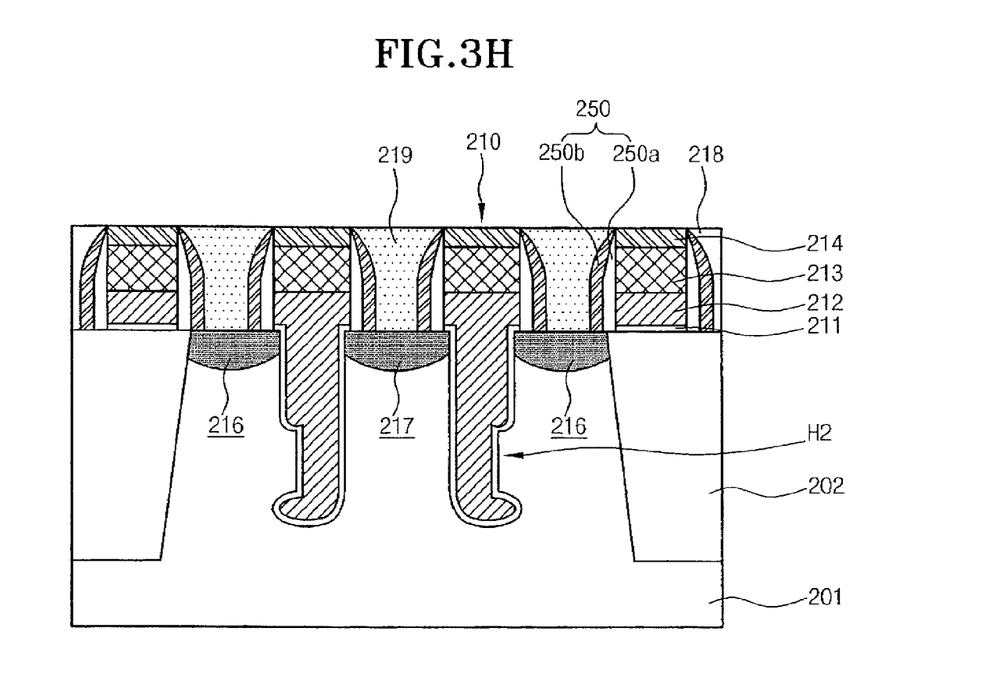

Referring to FIG. 3H, the remaining oxide layer 208 is removed. After a gate insulation layer 211 is formed on the surface of the resultant substrate 201 including the asymmetric bulb-type grooves H2, a polysilicon layer 212 is deposited as a first gate conductive layer on the gate insulation layer 211 to fill the asymmetric bulb-type grooves H2. The surface of the polysilicon layer 212 is planarized by a CMP process. A metallic layer, such as a tungsten silicide layer 213, is deposited on the planarized polysilicon layer 212 as a second conductive layer, and a hard mask layer 214 comprising a nitride layer is deposited on the tungsten silicide layer 213.

A gate mask (not shown) is formed on the hard mask layer 214. The hard mask layer 214 is etched using the gate mask. In succession, the tungsten silicide layer 213, the polysilicon layer 212 and the gate insulation layer 211 are sequentially etched, thereby forming asymmetric bulb-type recess gates 210 in the asymmetric bulb-type grooves H2.

The gate mask is completely removed while the etching of the layers positioned under the gate mask proceeds. If the gate mask is not completely removed, the remaining gate mask is completely removed through a separate etching process.

Thus, since the pair of asymmetric bulb-type recess gates formed in the cell have a structure in which the bulb grooves are defined on the lower end portions facing the source forming areas, the interval between the lower ends of the adjoining gates is not decreased.

After a spacer oxide layer and a spacer nitride layer are sequentially deposited on the entire surface of the substrate 201 including the asymmetric bulb-type recess gates 210 through the anisotropically etching of the spacer oxide layer and the spacer nitride layer, gate spacers 215, each of which comprises a double layer composed of an oxide layer 215a and a nitride layer 215b, are formed on both sidewalls of the asymmetric bulb-type recess gates 210.

By conducting a highly doped impurity ion implantation process for the resultant substrate 201 which is formed with the gate spacers 215, source and drain areas 216 and 217 are formed on the surface of the substrate 201 on both sides of the asymmetric bulb-type recess gates 210.

After an interlayer insulation layer 218 is deposited on the entire surface of the resultant substrate 201 which is formed with the source and drain areas 216 and 217, landing plugs 219 are formed on the source and drain areas 216 and 217 between the asymmetric bulb-type recess gates 210 including the gate spacers 215 through the conventional landing plug contact ("LPC") process.

Thereafter, while not specifically shown in the drawings, the manufacture of the semiconductor device having an asymmetric bulb-type recess gate in accordance with the present invention is completed by sequentially conducting a series of subsequent processes.

As is apparent from the above description, a bulb-type groove in the present invention is defined so as to increase the effective channel length. In particular, the bulb-type groove is partially defined only on the lower end portion of the sidewall of a groove facing a source area, thereby creating an asymmetric bulb-type recess gate. Consequently, in the present invention, since an effective channel length is increased and the interval between adjoining gates is not decreased, it is possible to prevent the changing of the threshold voltage and the degradation of the leakage current characteristic due to the reciprocal influence between the adjoining gates. As a result, according to the present invention, it is possible to create a highly integrated semiconductor device having excellent characteristics.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming a device isolation structure in a silicon substrate, which delimits an active region having a pair of gate forming areas, a drain forming area between the gate forming areas, and source forming areas outside the gate forming areas;
    forming a hard mask on the silicon substrate including the device isolation structure to have openings for exposing the gate forming areas;
    defining first grooves by etching the exposed gate forming areas;
    forming spacers on the sidewalls of the first grooves including the openings of the hard mask facing the source forming areas;
    defining second grooves under the first grooves by etching exposed bottom portions of the first grooves using the hard mask including the spacers as an etch mask;
    removing the spacers and the hard mask;
    forming an oxide layer on the surface of the substrate including the first and second grooves to expose the lower end portions of the sidewalls of the second grooves, which face the source forming areas;
    defining asymmetric bulb-type grooves including the first and second grooves by isotropically etching the exposed lower end portions of the sidewalls of the second grooves, thereby forming bulb-type grooves;
    removing the oxide layer;
    forming asymmetric bulb-type recess gates in the asymmetric bulb-type grooves; and
    forming source and drain areas on the surface of the substrate on both sides of the asymmetric bulb-type recess gates,
    wherein the step of forming spacers comprises:
    forming a spacer layer on the hard mask including the first grooves;
    forming spacers on both sidewalls of the first grooves including the openings of the hard mask by anisotropically etching the spacer layer;
    forming a photoresist pattern on the resultant substrate having the spacers formed on both sidewalls of the first grooves including the openings of the hard mask, such that spacers, which are formed on sidewalls of the first grooves facing the source forming areas, are covered by the photoresist pattern, and spacers, which are formed on sidewalls of the first grooves facing the drain forming area, are exposed;
    removing the exposed spacers formed on the sidewalls of the first grooves facing the drain forming area; and
    removing the photoresist pattern.

2. The method of claim 1, wherein the hard mask is formed as a stacked layer of an oxide layer and a polysilicon layer.

3. The method of claim 2, wherein the step of forming an oxide layer to expose lower end portions of the sidewalls of the second grooves facing the source forming areas comprises:
    inclinedly implanting oxygen ions into the resultant substrate with the spacers and the hard mask removed, such that the oxygen ions are implanted only into portions of the resultant substrate, excluding the lower end portions of the sidewalls of the second grooves facing the source forming areas;
    forming an oxide layer on the surface of the substrate including the first and second grooves by conducting an oxidation process for the resultant substrate containing the implanted oxygen ions, such that the thickness of the oxide layer on one portion of the resultant substrate containing the implanted oxygen ions is greater than the thickness of the oxide layer on the other portion of the resultant substrate not containing implanted oxygen ions; and
    wet etching the oxide layer to a thickness, such that portions of the oxide layer formed on the lower end portions of the sidewalls of the second grooves facing the source forming areas are removed.

4. The method of claim 3, wherein inclined ion implantation of the oxygen ions is conducted at an angle of 1~10° with an energy of 1~50 KeV and a concentration of 1E12~5E15 ions/cm$^2$.

5. The method of claim 2, wherein the step of defining the asymmetric bulb-type grooves is implemented in a manner such that isotropic etching is conducted for 10~60 seconds using Cl2, HBr and CF4 gases.

6. The method of claim 2, wherein the step of forming asymmetric bulb-type recess gates comprises:
    forming a gate insulation layer on a portion of the substrate surface including the asymmetric bulb-type grooves;
    forming a first gate conductive layer on the gate insulation layer filling the asymmetric bulb-type grooves;
    planarizing a surface of the first gate conductive layer;
    sequentially forming a second gate conductive layer and a hard mask layer on the planarized first gate conductive layer; and
    etching the hard mask layer, the second gate conductive layer, the first gate conductive layer and the gate insulation layer.

7. The method of claim 6, further comprising the step of:
forming gate spacers after performing the step of etching the hard mask layer, the second gate conductive layer, the first gate conductive layer and the gate insulation layer.

8. The method of claim 7, wherein the gate spacer comprises a double layer which is composed of an oxide layer and a nitride layer.

9. The method of claim 7, further comprising the step of:
forming landing plugs on the source and drain areas between the asymmetric bulb-type recess gates after performing the step of forming the gate spacers.

10. A method for manufacturing a semiconductor device, comprising the steps of:
forming a device isolation structure in a silicon substrate, which delimits an active region having a pair of gate forming areas, a drain forming area between the gate forming areas, and source forming areas outside the gate forming areas;
forming a hard mask on the silicon substrate including the device isolation structure to have openings for exposing the gate forming areas;
defining first grooves by etching the exposed gate forming areas;
forming spacers on the sidewalls of the first grooves including the openings of the hard mask facing the source forming areas;
defining second grooves under the first grooves by etching exposed bottom portions of the first grooves using the hard mask including the spacers as an etch mask;
removing the spacers and the hard mask;
forming an oxide layer on the surface of the substrate including the first and second grooves to expose the lower end portions of the sidewalls of the second grooves, which face the source forming areas;
defining asymmetric bulb-type grooves including the first and second grooves by isotropically etching the exposed lower end portions of the sidewalls of the second grooves, thereby forming bulb-type grooves;
removing the oxide layer;
forming asymmetric bulb-type recess gates in the asymmetric bulb-type grooves; and
forming source and drain areas on the surface of the substrate on both sides of the asymmetric bulb-type recess gates,
wherein the step of forming an oxide layer to expose lower end portions of the sidewalls of the second grooves facing the source forming areas comprises:
inclinedly implanting oxygen ions into the resultant substrate with the spacers and the hard mask removed, such that the oxygen ions are implanted only into portions of the resultant substrate, excluding the lower end portions of the sidewalls of the second grooves facing the source forming areas;
forming an oxide layer on the surface of the substrate including the first and second grooves by conducting an oxidation process for the resultant substrate containing the implanted oxygen ions, such that the thickness of the oxide layer on one portion of the resultant substrate containing the implanted oxygen ions is greater than the thickness of the oxide layer on the other portion of the resultant substrate not containing implanted oxygen ions; and
wet etching the oxide layer to a thickness, such that portions of the oxide layer formed on the lower end portions of the sidewalls of the second grooves facing the source forming areas are removed.

11. The method of claim 10, wherein inclined ion implantation of the oxygen ions is conducted at an angle of 1~10° with an energy of 1~50 KeV and a concentration of 1E12~5E15 ions/cm$^2$.

* * * * *